United States Patent
Eker et al.

(10) Patent No.: US 8,094,754 B2
(45) Date of Patent: *Jan. 10, 2012

(54) FREQUENCY HOLD MECHANISM IN A CLOCK AND DATA RECOVERY DEVICE

(75) Inventors: Mehmet Mustafa Eker, San Marcos, CA (US); Simon Pang, San Diego, CA (US); Viet Linh Do, Carlsbad, CA (US); Hongming An, San Diego, CA (US); Philip Michael Clovis, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 619 days.

This patent is subject to a terminal disclaimer.

(21) Appl. No.: 12/327,776

(22) Filed: Dec. 3, 2008

(65) Prior Publication Data

US 2009/0092213 A1    Apr. 9, 2009

Related U.S. Application Data

(63) Continuation-in-part of application No. 12/194,744, filed on Aug. 20, 2008, which is a continuation-in-part of application No. 12/120,027, filed on May 13, 2008, which is a continuation-in-part of application No. 11/717,262, filed on Mar. 13, 2007, now Pat. No. 7,826,563, and a continuation-in-part of application No. 11/954,325, filed on Dec. 12, 2007, said application No. 12/327,776 is a continuation-in-part of application No. 11/595,012, filed on Nov. 9, 2006, now Pat. No. 7,720,189.

(51) Int. Cl.
*H03D 3/24* (2006.01)
(52) U.S. Cl. ........ 375/327; 375/324; 375/322; 375/316; 331/1; 331/17; 455/260
(58) Field of Classification Search ................. 375/327, 375/324, 322, 316; 331/1, 17, 260
See application file for complete search history.

(56) References Cited

U.S. PATENT DOCUMENTS

2009/0147901 A1 *   6/2009   Do et al. .................. 375/375

OTHER PUBLICATIONS

Pottbacker at al,, "A Si Bipolar Pahse and Frequency Detector IC for Clock Extraction up to 8 Gb/s", IEEE Journal of Solid-State Circuits, vol, SC-27, pp. 1747-1751, Dec. 1992.
C. Andrew Sharpe, "A 3-State phase detector can improve your next PLL design", EDN Magazine, pp. 224-228, Sep. 20, 1976.
Charles Hogge Jr., "A Self Correcting Clock Recovery Circuit, IEEE Journal of Lightwave Technology", vol. LT-3, pp. 1312-1314, Dec. 1985.

\* cited by examiner

*Primary Examiner* — David Payne
*Assistant Examiner* — Zewdu Kassa
(74) *Attorney, Agent, or Firm* — Law Office of Gerald Maliszewski; Gerald Maliszewski

(57) ABSTRACT

A system and method are provided for holding the frequency of a non-synchronous communication signal in a clock and data recovery (CDR) device frequency synthesizer. The method initially acquires the phase of a non-synchronous first communication signal having a first frequency, and divides a first synthesized signal by a selected frequency ratio value, creating a frequency detection signal having a frequency equal to a reference signal frequency. In response to losing the first communication signal and subsequently receiving a second communication signal with a non-predetermined second frequency, the frequency ratio value is retrieved from memory based upon the assumption that the second frequency is the same, or close to the first frequency. Using a phase-frequency detector (PFD), the reference signal, and the frequency ratio value, a second synthesized signal is generated having an output frequency equal to first frequency. Using a rotational frequency detector (RFD), the second communication signal, and the second synthesized signal, a second synthesized signal is generated having an output frequency equal to second frequency.

18 Claims, 14 Drawing Sheets

| Mode | total_contribution[4:0] | total_contribution values |
|---|---|---|
| First Order | $contribution1 = c_1[n]$ | 0,1 |
| Second Order | $contribution1 + contribution2 = c_1[n] + c_2[n] - c_2[n-1]$ | -1,0,1,2 |
| Third Order | $contribution1 + contribution2 + contribution3 =$ $c_1[n] + c_2[n] - c_2[n-1] + c_3[n] - 2c_3[n-1] + c_3[n-2]$ | -3,-2,-1,0,1,2,3,4 |
| Fourth Order | $contribution1 + contribution2 + contribution3 + contribution4 =$ $c_1[n] + c_2[n] - c_2[n-1] + c_3[n] - 2c_3[n-1] + c_3[n-2] +$ $c_4[n] - 3c_4[n-1] + 3c_4[n-2] - c_4[n-3]$ | -7,-6,-5,-4,-3,-2, -1,0,1,2,3,4,5,6,7,8 |

FIG. 2
*(Prior Art)*

FREQUENCY HOLD MECHANISM IN A CLOCK AND DATA RECOVERY DEVICE

RELATED APPLICATIONS

This application is a continuation-in-part of a pending application entitled, FREQUENCY REACQUISITION IN A CLOCK AND DATA RECOVERY DEVICE, invented by Do et al., Ser. No. 12/194,744, filed Aug. 20, 2008, which is a continuation-in-part of:

a pending application entitled, FREQUENCY SYNTHESIS RATIONAL DIVISION, invented by Do et al., Ser. No. 12/120,027, filed May 13, 2008, which is a continuation-in-part of:

pending application entitled, HIGH SPEED MULTI-MODULUS PRESCALAR DIVIDER, invented by An et al. Ser. No. 11/717,262, filed Mar. 13, 2007 now U.S. Pat. No. 7,826,563; and, FLEXIBLE ACCUMULATOR FOR RATIONAL DIVISION, invented by Do et al. Ser. No. 11/954,325, filed Dec. 12, 2007.

This application is a continuation-in-part of a pending application entitled, SYSTEM AND METHOD FOR AUTOMATIC CLOCK FREQUENCY ACQUISITION, invented by Do et al., Ser. No. 11/595,012, filed Nov. 9, 2008 now U.S. Pat. No 7,720,189. All the above-referenced applications are incorporated herein by reference.

BACKGROUND OF THE INVENTION

1. Field of the Invention

This invention generally relates to a phase-locked loop (PLL) frequency synthesis system and, more particularly, to a system and method for rapidly requiring the phase of a communication signal having an unknown frequency.

2. Description of the Related Art

Voltage controlled oscillators are commonly used in monolithic clock data recovery (CDR) units, as they're easy to fabricate and provide reliable results. Clock recovery PLLs generally don't use phase-frequency detectors (PFDs) in the data path since the incoming data signal isn't deterministic. PFDs are more typically used in frequency synthesizers with periodic (deterministic) signals. Clock recovery PLLs use exclusive-OR (XOR) based phase detectors to maintain quadrature phase alignment between the incoming data pattern and the re-timed pattern. XOR based phase detectors have limited frequency discrimination capability, generally restricting frequency offsets to less than the closed loop PLL bandwidth. This characteristic, coupled with the wide tuning range of the voltage controlled oscillator (VCO), requires CDR circuits to depend upon an auxiliary frequency acquisition system.

There are two basic PLL frequency acquisition techniques. The first is a VCO sweep method. During an out-of-lock condition, auxiliary circuits cause the VCO frequency to slowly sweep across its tuning range in search, of an input signal. The sweeping action is halted when a zero-beat note is detected, causing the PLL to lock to the Input signal. The VCO sweep method is generally used in microwave frequency synthesis applications. The second type of acquisition aid, commonly found in clock recovery circuits, uses a PFD in combination with an XOR phase detector. When the PLL is locked to a data stream, the PLL switches over to a PFD that is driven by a stable reference clock source. The reference clock frequency is proportional to the data stream rate. For example, if the data stream rate is D and the reference clock rate is R, then D$\alpha$R. However, since the reference clock has only a few rate settings, it is unlikely that R is equal to the receive data rate. To create a reference equal to the data rate a fractional ratio of R must, be used; such as D=n/d*R.

In this manner, the VCO frequency is held very close to the data rate. Keeping the VCO frequency in the proper range of operation facilitates acquisition of the serial data and maintains a stable downstream clock when serial data isn't present at the CDR input. When serial data is applied to the CDR, the XOR based phase detector replaces the PFD, and data re-timing resumes.

It is common for a PLL to use a divider in the feedback path, so that the PFD can operate at lower frequencies. In the simplest case, the divisor is a fixed integer value. Then, a frequency divider is used to produce an output clock that is an integer multiple of the reference clock. If the divider cannot supply the required divisor, or if the output clock is not an integer multiple of the reference clock, the required divisor may be generated by toggling between two integer values, so that an average divisor results. By placing a fractional divider (1/N) into this feedback path, a fractional multiple of the input reference frequency can he produced at the output of this fractional-N PLL.

However, it is difficult to determine a divisor, either fixed or averaged, if the frequency of the data stream is not known beforehand. For this reason, CDR devices are typically designed to operate at one or more predetermined data stream baud rates, Conventional fractional-N frequency synthesizers use fractional number decimal values in their PLL architectures. Even synthesizers that are conventionally referred to as "rational" frequency synthesizers operate by converting a rational number, with an integer numerator and integer denominator, into resolvable or approximated fractional numbers. These frequency synthesizers do not perform well because of the inherent fractional spurs that are generated in response to the lack of resolution of the number of bits representing the divisor in the feedback path of the frequency synthesizer.

FIG. 1 is a schematic block diagram depicting an accumulator circuit capable of performing a division operation (prior art). As noted in "A Pipelined Noise Shaping Coder for Fractional-N Frequency Synthesis", by Kozak et al., IEEE Trans, on Instrumentation and Measurement. Vol. 50, No. 5, October 2001, the depicted $4^{th}$ order device can be used to determine a division ratio using an integer sequence.

The carry outs from the 4 accumulators are cascaded to accumulate the fractional, number. The carry outs are combined to reduce quantization noise by adding their contributions are follows:

contribution 1=c1[n];
contribution 2=c2[n]·c2[n−1];
contribution 3=c3[n]·2c3[n−1]+c3[n−2];
contribution 4=c4[n]·3c4[n−1]+3c4[n−2]·c4[n−3];

where n is equal to a current time, and (n−1) is the previous time, Cx[n] is equal to a current value, and Cx[n−1] is equal to a previous value.

FIG. 2 shows the contributions made by the accumulator depicted in FIG. 1 with respect to order (prior art). A fractional number or fraction, is a number that expresses a ratio of a numerator divided by a denominator. Some fractional numbers are rational—meaning that the numerator and denominator are both integers. With an irrational number, either the numerator or denominator is not an integer (e.g., n). Some rational numbers cannot be resolved (e.g., 10/3), while other rational numbers may only be resolved using a large number of decimal (or bit) places. In these cases, or if the fractional number is irrational, a long-term mean of the integer sequence must be used as an approximation.

The above-mentioned resolution problems are addressed, with the use of a flexible accumulator, as described in parent application Ser. No. 11/954,325, The flexible accumulator is capable of performing rational division, or fractional division if the fraction cannot be sufficiently resolved, or if the fraction is irrational. The determination of whether a fraction is a rational number may be trivial in a system that transmits at a single frequency, especially if the user is permitted to select a convenient reference clock frequency. However, modern communication systems are expected to work at a number of different synthesized frequencies using a single reference clock. Further, the systems must be easily reprogrammable for different synthesized frequencies, without changing the single reference clock frequency.

As noted above, modern communication systems are expected to operate at a number of frequencies. In some circumstances the communication signal frequencies are unknown, (not predetermined). While it is relatively straightforward to reacquire the phase of a signal if the signal frequency is predetermined, it is necessarily more difficult to reacquire phase if the frequency is unknown. Similarly, it is relatively easy to hold on to the frequency of a temporarily interrupted signal if the signal frequency is predetermined. However, if the signal frequency is unknown, a temporary interruption conventionally requires that the frequency acquisition process be restarted. During this frequency reacquisition process, data is lost.

It would be advantageous if a means existed for holding the frequency of a temporarily interrupted signal or bursty transmissions with a non-predetermined frequency, to avoid a lengthy frequency reacquisition process,

SUMMARY OF THE INVENTION

The system and method described herein permits a frequency-hold capability in a continuous rate clock and data recovery (CDR) device. The enabled device is able to handle burst, transmissions without frequency reacquisition, and quickly adapts to small variations in the input data rate. The enabled device maintains the operating frequency in the event of a loss of lock (LOL) or loss of signal (LOS), and provides a stable clock to peripheral devices, even if the input data has been lost.

In a continuous rate CDR system, frequency ratio detection is performed after the phase-locked loop (PLL) has been locked by a phase detector. If the CDR system, is locked, the frequency range of the selected VCO band already is known. A calculated frequency ratio resides within this frequency range. If the received signal is temporarily lost, if the received signal frequency varies, or if the received signal is bursty, it is possible to take advantage of the calculated frequency ratio. Using a rotational frequency detector (RED) and the calculated frequency ratio, the device is able to hold on to the received signal frequency, and then acquire phase.

Accordingly, a method is provided for holding the frequency of a non-synchronous communication signal in a clock and data recovery device frequency synthesizer. The method initially acquires the phase of a non-synchronous first communication signal having a first frequency, and divides a first synthesized signal by a selected frequency ratio value, creating a frequency detection signal having a frequency equal to a reference signal frequency. This frequency ratio value is saved in memory. In response to losing the first communication signal and subsequently receiving a second communication signal with a non-predetermined second frequency, the frequency ratio value is retrieved from memory based upon the assumption that the second frequency is the same, or close to the first frequency. Using a phase-frequency detector (PFD), the reference signal, and the frequency ratio value, a second synthesized signal is generated having an output frequency equal to first frequency. Using a rotational frequency detector (RFD), the second communication signal, and the second synthesized signal, the second synthesized signal is adjusted to have an output frequency equal to second frequency. Advantageously, this method is able to use a single reference frequency to acquire and bold on to any input signal frequency.

Subsequent to acquiring second frequency, a phase detector (PHD) is used to compare the second synthesized output frequency to the second communication signal, and the phase of the second communication signal is acquired. Then, the frequency ratio value is updated.

Additional details of the above-described method and a system for holding frequency in a non-synchronous communication signal in a CDR device frequency synthesizer are presented below.

BRIEF DESCRIPTION OF THE DRAWINGS

FIG. 2 shows the contributions made by the accumulator depleted in FIG. 1 with respect to order (prior art)

DETAILED DESCRIPTION

Figure 1:
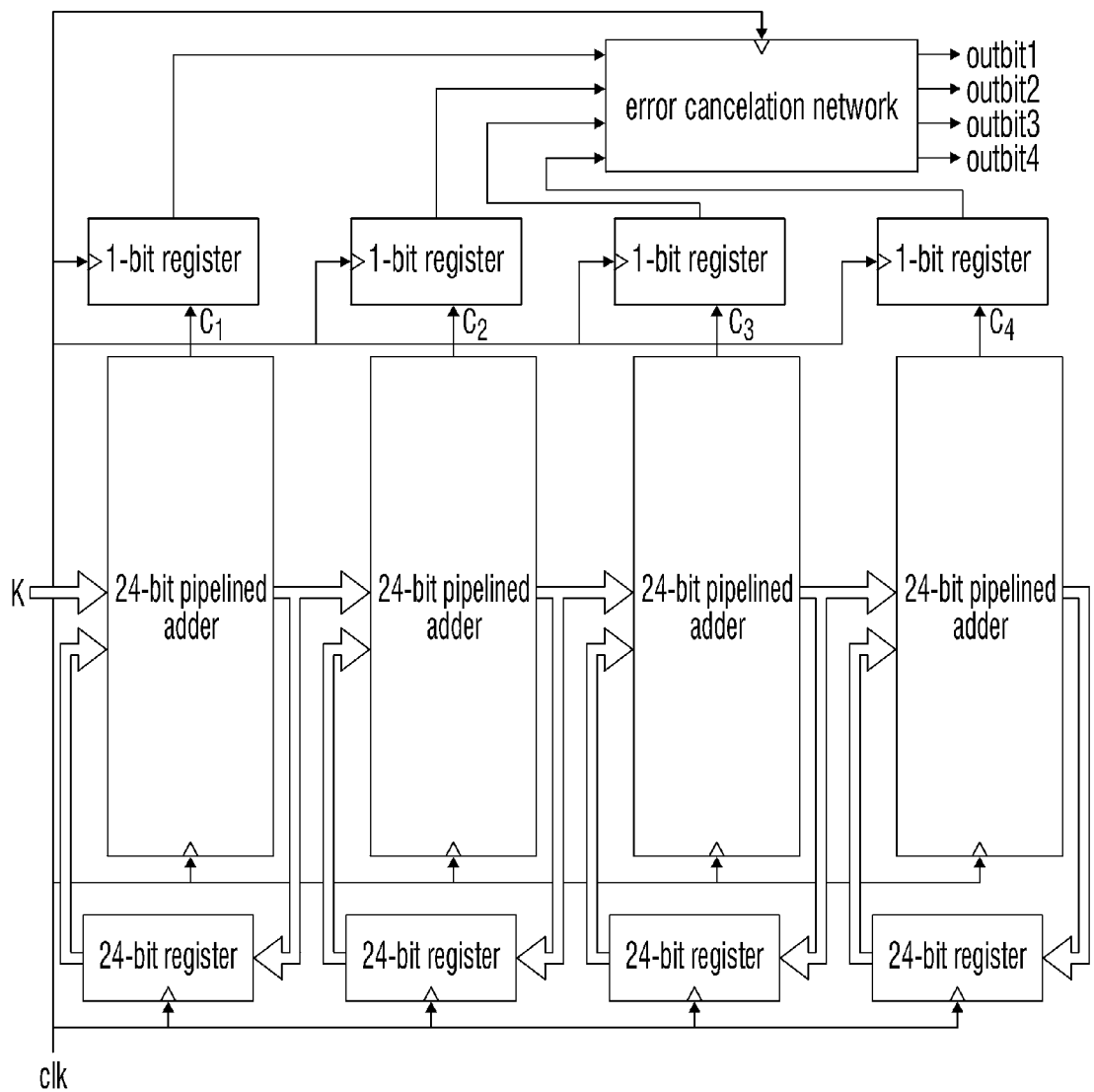
FIG. 1 is a schematic block diagram depicting an accumulator
circuit capable of performing a division operation (prior art).

Various embodiments are now described with reference to the drawings. In the following description, for purposes of explanation, numerous specific details are set forth in order to provide a thorough understanding of one or more aspects. It may be evident, however, that such embodiments) may be practiced without these specific details. In other instances, well-known structures and devices are shown in block diagram form in order to facilitate describing these embodiments.

As used in this application, the terms "processor", "processing device", "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Various embodiments will be presented in terms of systems that may include a number of components, modules, and the like. It is to be understood and appreciated, that the various systems may include additional, components, modules, etc. and/or may not include all of the components, modules etc, discussed in connection with the figures. A combination of these approaches may also be used.

The various illustrative logical blocks, modules, and circuits that have been described may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC. The ASIC may reside in the node, or elsewhere. In the alternative, the processor and the storage medium may reside as discrete components in the node, or elsewhere in an access network.

Figure 3:
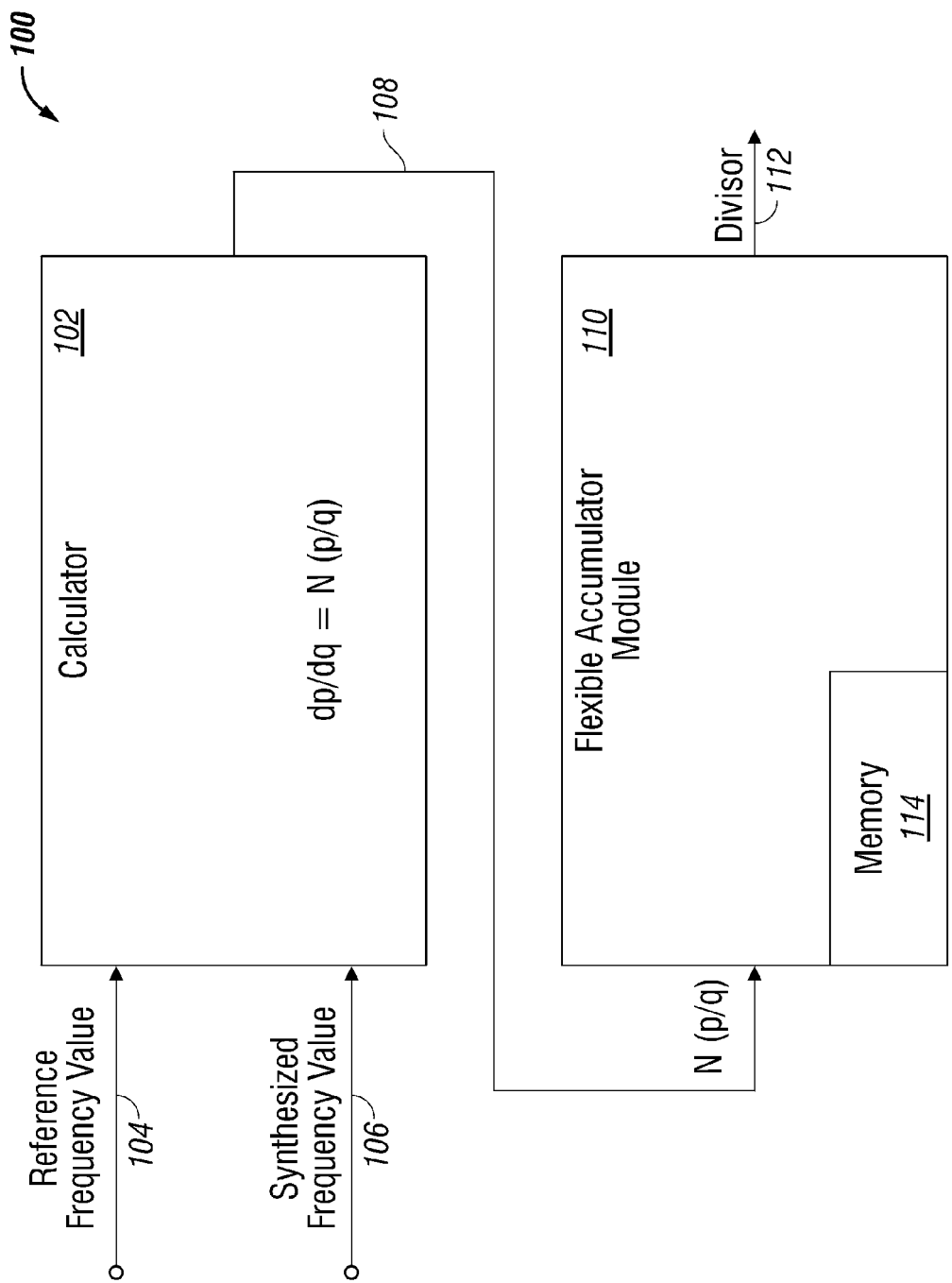
FIG. 3 is a schematic block diagram depicting a system for synthesizing signal frequencies using rational division.

FIG. 3 is a schematic block diagram depicting a system for synthesizing signal frequencies using rational division. The system 100 comprises a calculator 102 having an input on line 104 to accept a reference frequency value and an input on line 106 to accept a synthesized frequency value. The calculator 102 divides the synthesized frequency value by the reference frequency value, and determines an integer value numerator (dp) and an integer value denominator (dq). The calculator 102 reduces the ratio of dp/dq to an integer N and a ratio of p/q (dp/dq=N(p/q)), where p/q<1 (decimal). The calculator 102 supplies N(p/q), where p is a numerator and q is a denominator, at an output on line 108. A flexible accumulator module 110 has an input on line 108 to accept N(p/q) and an output on line 112 to supply a divisor. For example, the calculator 102 may supply an n-hit binary numerator and an (n+1)-bit binary denominator. The divisor may be stored in a tangible memory medium (e.g., random access memory (RAM) or non-volatile memory) for subsequent use, as described, below.

Figure 4:
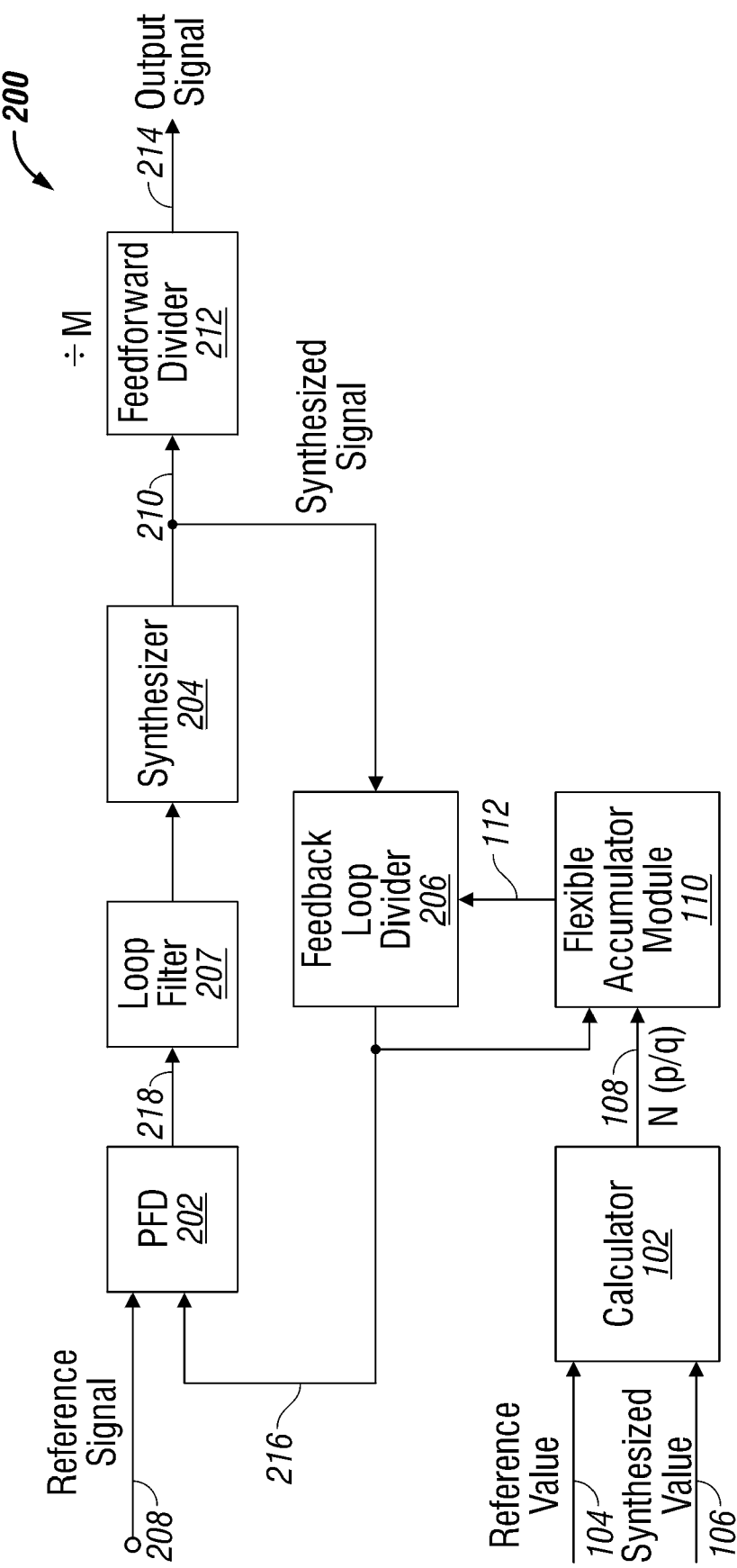
FIG. 4 is a schematic block diagram depicting the system of FIG. 3 is the context of a phase-locked loop (PLL).

FIG. 4 is a schematic block diagram depicting the system of FIG. 3 is the context of a phase-locked loop (PLL) 200. The PLL 200 includes a phase/frequency detector (PFD) 202, a frequency synthesizer 204, and a feedback loop divider 208. Typically, a PLL may also include a loop filer and charge pump 207. The PFD 202 accepts a reference signal on line 208 having a frequency equal to the reference frequency value. The frequency synthesizer 204 generates a synthesized signal on line 210 having a frequency equal to the synthesized frequency value. The flexible accumulator module 110 sums N with a k-bit quotient, creates the divisor, and supplies the divisor to the feedback loop divider 208 on line 112.

Figure 5:
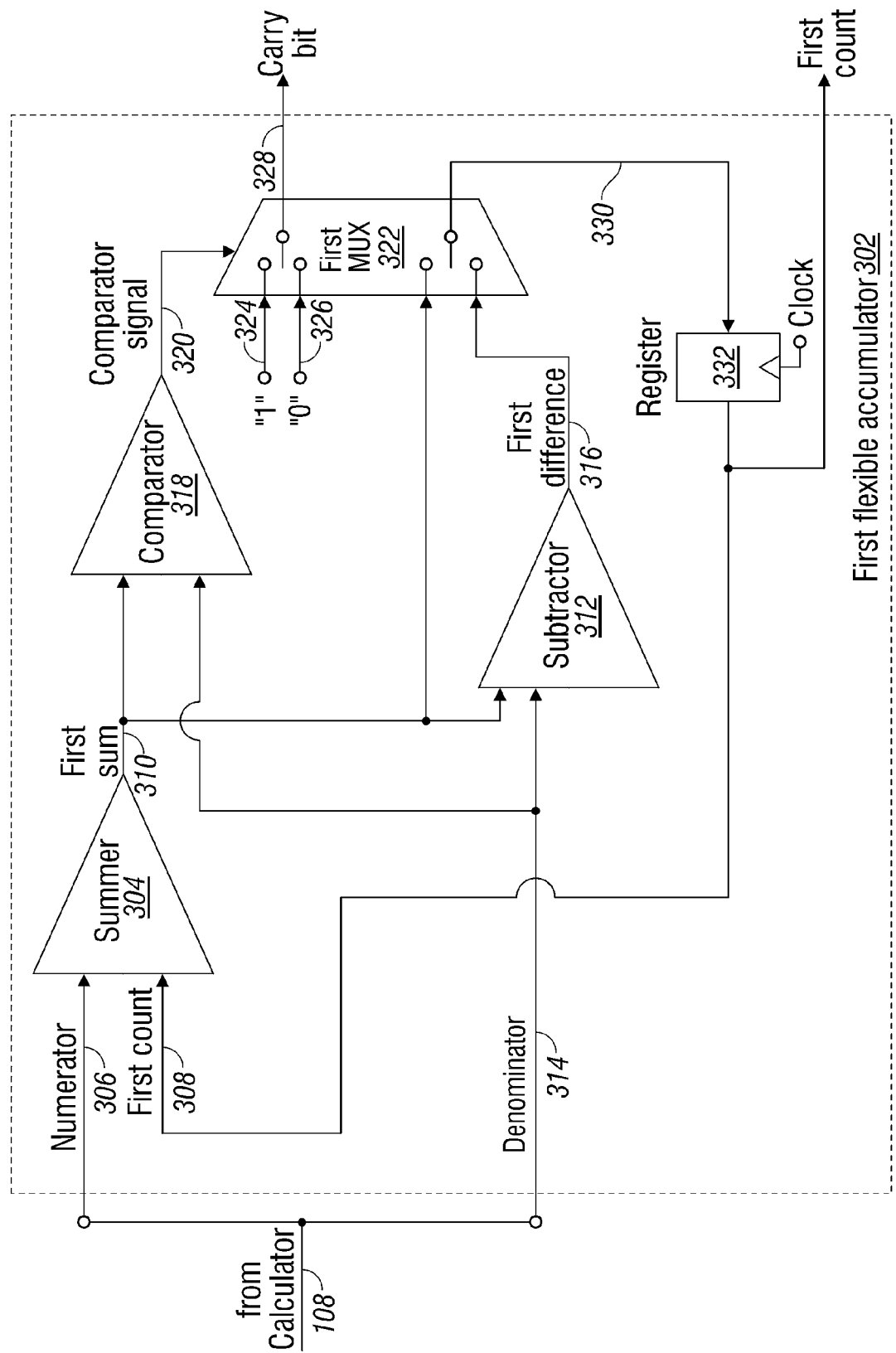
FIG. 5 is a schematic block diagram depicting a first flexible accumulator of the flexible accumulator module.

FIG. 5 is a schematic block diagram depicting a first flexible accumulator of the flexible accumulator module. A flexible accumulator is capable of either rational or fractional division. As explained in more detail below, rational division relies upon the use of a numerator (dividend) and a denominator (divisor) that are used to form a true rational number. That is, the numerator and denominator are integer inputs to the flexible accumulator. Alternately stated, the input need not he a quotient derived from a numerator and denominator. The first flexible accumulator 302 includes a first summer 304 having an input on line 306 to accept a binary numerator (p). Summer 304 has an input on line 308 to accept a binary first count from a previous cycle and an output on line 310 to supply a binary first sum of the numerator and the first count.

A first subtracter 312 has an input on line 314 to accept a binary denominator (q), an input on line 310 to accept the first sum, and an output on line 316 to supply a binary first difference between the first sum and the denominator. Note: the numerator (p) and denominator (q) on hues 308 and 314, respectively, are components of the information supplied by the calculator on line 108. A first comparator 318 has an input on line 310 to accept the first sum, an input on line 314 to accept the denominator, and an output on line 320 to supply a first comparator signal. A first multiplexer (MUX) 322 has an input to accept carry bits. A "1" carry hit is supplied on line 324 and a "0" carry bit is supplied on line 326. The MUX 322 has a control input on line 320 to accept the first comparator signal, and an output on line 328 to supply a first carry hit in response to the first comparator signal.

More explicitly, the first MUX 322 supplies a binary "1" first carry bit on line 328 if the first comparator signal on line 320 indicates that the first stun is greater than the denominator. The MUX 322 supplies a binary "0" first carry bit if the first comparator signal indicates that the first sum is less than or equal to the denominator. The first MUX 322 has an input on line 310 to accept the first sum, an input on line 318 to accept the first difference, and an output on line 330 to supply the first count in response to the comparator signal. Note: the first count from first MUX 322 on line 330 becomes the first count from a subsequent cycle on line 308 after passing through clocked register or delay circuit 332. As explained, in more detail below, line 308 may also connected as an output port (count) to another, higher order flexible accumulator.

The first MUX 322 supplies the first difference as the first count on line 308 for the subsequent cycle if the first comparator signal indicates that the first sum is greater than the denominator. The first MUX 322 supplies the first sum as the first count in the subsequent cycle if the first comparator signal indicates that first sum is less than or equal to the denominator. Alternately but not shown, the accumulator may be comprised of two MUX devices, one for selecting the carry bit and one for selecting the first count.

In one aspect, the first summer accepts an n-bit binary numerator on line 306, an n-bit first count on line 308 from the previous cycle, and supplies an (n+1)-bit first sum on line 310. The first subtracter 312 accepts an (n+1)-bit binary denominator on line 314 and supplies an n-bit first difference on line 316.

Typically, first summer 304 accepts the numerator with a value, and the first subtracter 312 accepts the denominator with a value larger than the numerator value. In one aspect, the combination of the numerator and denominator form a rational number. That is, both the numerator and denominator are integers. However, the numerator and denominator need not necessarily form a rational number. Alternately expressed, the first summer 304 may accept an n-bit numerator that is a repeating sequence of binary values, or the numerator may be the most significant bits of a non-repeating sequence. The non-repeating sequence may be represented by r, an irrational number or a rational number that cannot be resolved (does not repeat) within a span of n bits. In this aspect, the first subtracter 312 accepts an (n+1)-bit denominator with a value equal to decimal $2^{(n+1)}$. Additional details of the flexible accumulator module can be found in parent application Ser. No. 11/954325.

Figure 8:
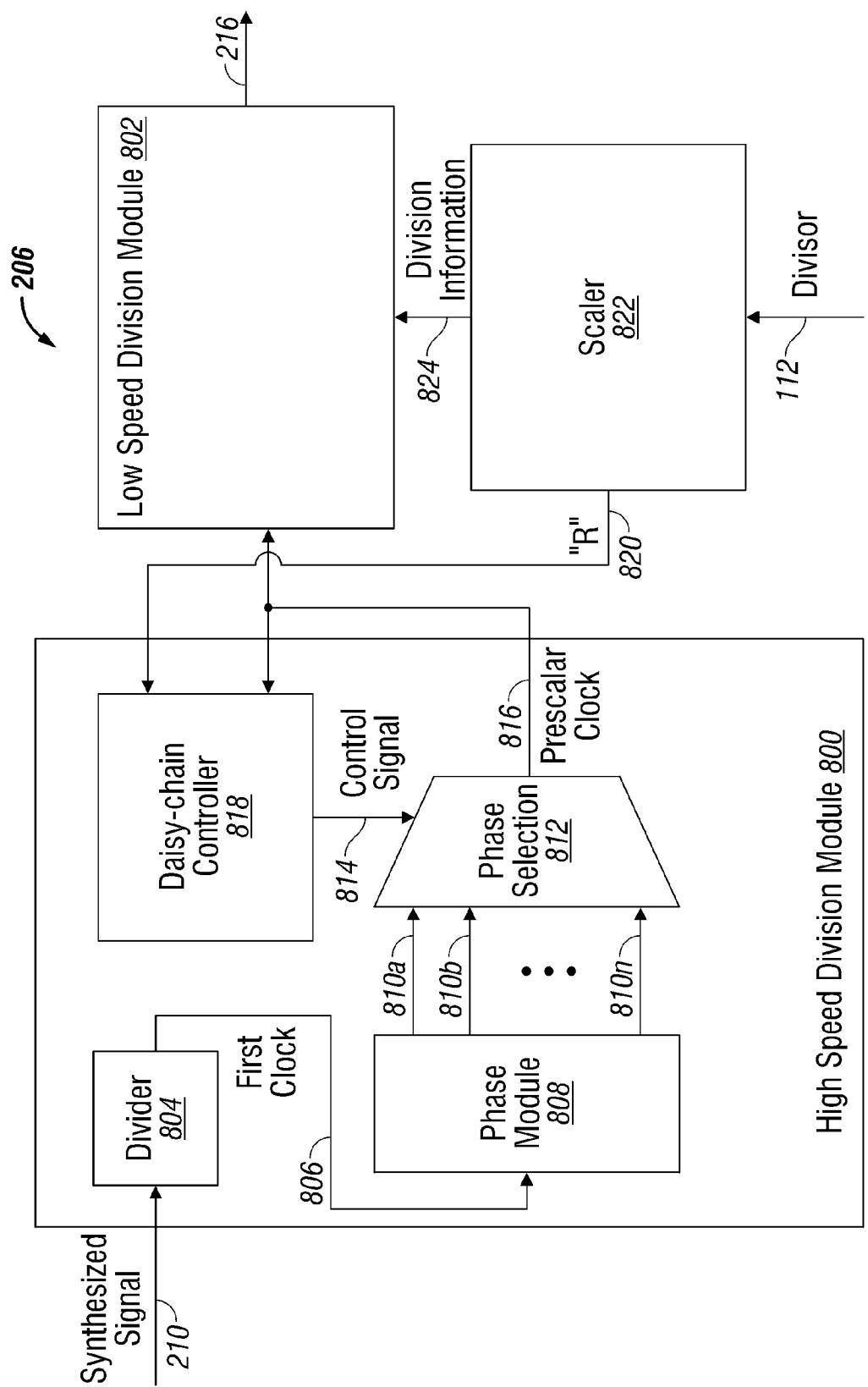
FIG. 8 is a schematic block diagram depicting the feedback loop divider of FIG. 4 is greater detail.

FIG. 8 is a schematic block diagram depicting the flexible accumulator module as a plurality of series-connected flexible accumulators. Generally, the flexible accumulator module generates a binary sequence from each, flexible accumulator and uses a plurality of binary sequences to generate the k-bit quotient.

A quotientizer 424 has an input on line 328 to accept the first binary sequence, an input on line 422 to accept the second binary sequence, and an output on line 428 to supply a k-bit quotient generated from the first and second binary sequences. In total, the flexible accumulator module 110 comprises m flexible accumulators, including an (m-1)th accumulator 440 and an mth accumulator 436. In this example, m=4. However, the module 110 is not limited to any particular number of flexible accumulators. Thus, the quotientizer has inputs 328, 422, 482, and 434 to accept m=4 binary sequences and the output 426 supplies a k-bit quotient generated from the m binary sequences. In one aspect, the quotientizer 424 derives the quotient as shown in FIGS. 1 and 2, and as explained below. Circuit 438 sums the k-bit quotient, on line 426 with the integer N to supply the divisor on line 112.

A fourth order system, using four series-connected accumulators has been depicted as an example. However, it should be understood that the system is not limited to any particular number of accumulators. Although the above-described values have been defined as binary values, the system could alternately be explained in the context of hexadecimal or decimal numbers.

Figure 6:
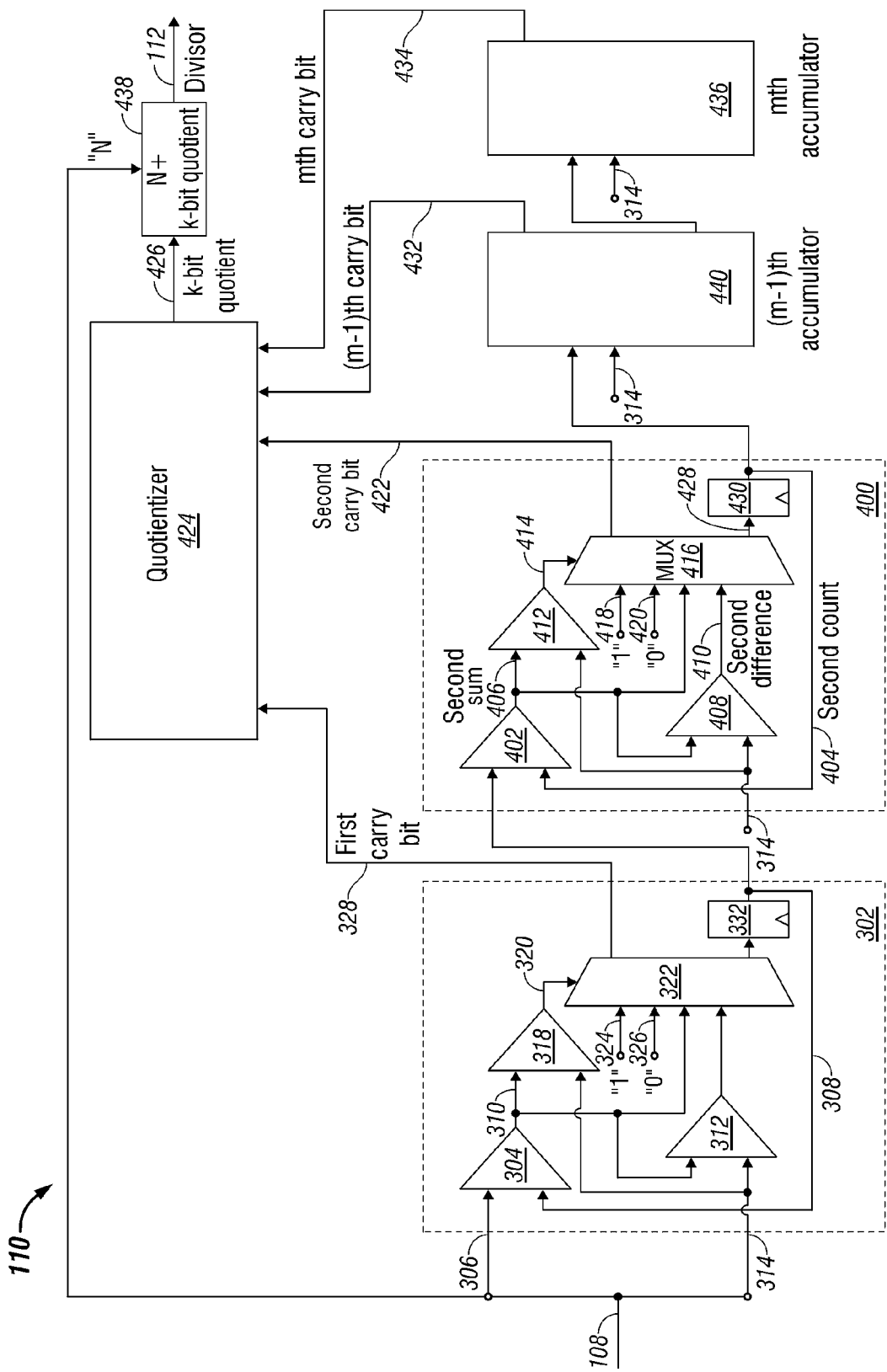
FIG. 6 is a schematic block diagram depicting the flexible accumulator module as a plurality of series-connected, flexible accumulators.
Figure 7:
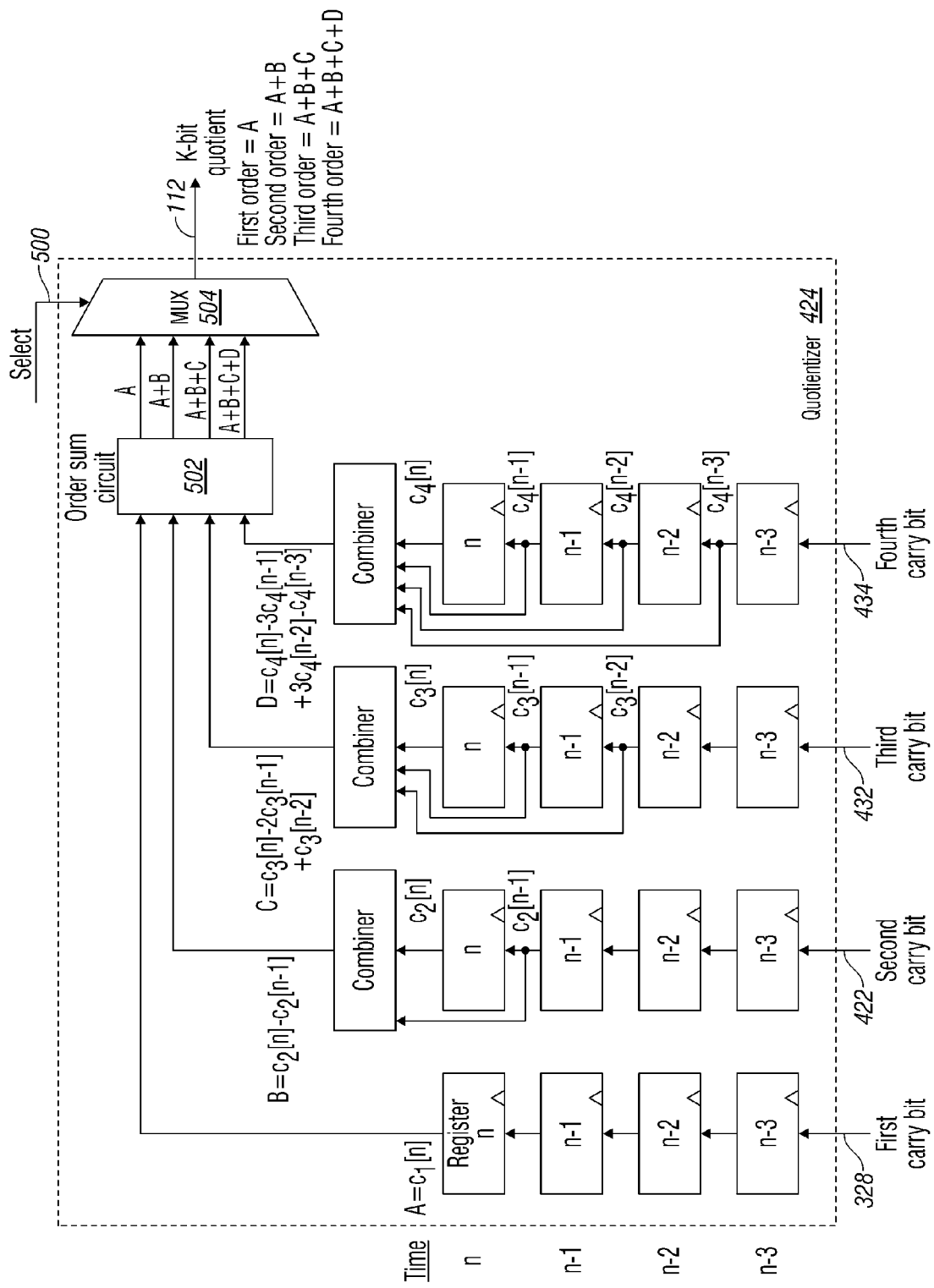
FIG. 7 is a schematic block diagram depicting the quotientizer of FIG. 6 in greater detail.

FIG. 7 is a schematic block diagram depicting the quotientizer of FIG. 6 in greater detail. Returning to the calculation of the quotient, the number of bits required from each contribution block is different. From FIG. 2 it can see that each order requires a different number of bits. For example, the first contribution (contribution1) has only two values: 0 and 1. So, only 1 bit, is needed. There is no need for a sign bit, as the value is always positive. The second contribution has possible 4 values: −1, 0, 1, and 2. So, 3 bits are needed, including 1 sign bit. The third contribution has 7 values: −3 to 4. So, 4 bits are required, including 1 sign bit. The fourth contribution has 15 values; −7 to 8. So, 5 bits are required, including 1 sign bit.

To generalize for "k" (the k-bit quotient), Pascal's formula may be used to explain how many hits is necessary for each, contribution (or order). For an m-order calculator, there are m flexible accumulators and m binary sequences. Each binary sequence (or carry bit) is connected to the input of one of the m sequences of shift registers. Thus, there are m signals combined from the m shift register sequences, corresponding to the m-binary sequences (or m-th carry bit) found using Pascal's formula. A 4-order calculator is shown in FIG. 7, with 4 shift register (delay) sequences, with each shift register sequence including 4 shift registers.

As a simplified alternative, each contribution may be comprised of the same number of bits, k, which is the total contribution (or order) for all contributions. These k-bit contributions are 2 complement numbers. In FIG. 2, k is equal to 5 bits [4:0].

The accumulator does not generate a sign bit. However, the carry outs from the accumulators are modulated in the calculator and the sign bit is generated. For example, the $2^{nd}$ order contribution=c2[n]−c2[n−1]. If c2[n]=0 and c2[n−1]=1, then the $2^{nd}$ order contribution=0−1 −1. Similarly, the third order contribution=c3[n]−2c3[n−1]+c3[n−2]. If c3[n]=0, c3[n−1]=1, and c3[n−2]=0, then the $3^{rd}$ order contribution=0−2×1+0=−2. For the $4^{th}$ order contribution=c4[n]−3c4[n−1]+3c4[n−2]−c4[n−3]. If c4[n]=0, c4[n−1]=1, c4[n−2]=0, and c4[n−3]=1, then the $4^{th}$ order contribution=0−3×1+3×0−1=−4. These contributions are added together in the "order sum circuit" 502 on the basis of order, and the order is chosen using MUX 504 and the select signal on line 500. FIG. 7 depicts one device and method for generating a quotient from accumulator carry bits. However, the system of FIG. 8 might also be enabled using a quotientizer that manipulates the accumulator carry bits in an alternate methodology.

Returning to FIG. 4, in one aspect the calculator 102 defines a resolution limit of j radix places, sets q=dq, and determines p. The calculator 102 supplies p and q to a flexible accumulator module 110 enabled for rational division when p can be represented as an integer using j, or less, radix places. Alternately, the calculator 102 supplies N(r/q) to a flexible accumulator module enabled for fractional division, where r is a non-resolvable number, when p cannot be represented as an integer using j radix places. When enabled for fractional division, r is supplied as the "numerator" on line 306 (see FIG. 5). Then, the "denominator" on line 314 is represented as an integer with a value larger than the fractional number. For example, the fractional number of line 306 may be an unresolved 31-bit binary number and the integer on line 314 may be a 32-bit number where the highest order radix place is "1" and all the lower orders are "0". Alternately stated, r may be a 31-bit non-resolvable numerator, and q a 32-bit denominator with a value equal, to decimal $2^{32}$. In one aspect, r is "rounded-off" to a resolvable value.

In one aspect, the PLL 200 of FIG. 4 includes a feedforward divider 212 to accept the synthesized signal on line 210 and an output on line 214 to supply an output signal having a frequency=(synthesized signal frequency)/M. In this aspect, the flexible accumulator module 110 creates the divisor by summing N, the k-bit quotient, and M. Likewise, the calculator 102 reduces to ratio M(dp/dq)=N(p/q)).

FIG. 8 is a schematic block diagram depicting the feedback loop divider of FIG. 4 is greater detail. The feedback loop divider 206 includes a high-speed division module 800 and a low-speed division module 802. The high-speed module 800 includes a divider 804 having an input on line 210 to accept the synthesized signal and an output on line 806 to supply a first clock signal having a frequency equal to the (synthesized signal frequency)/J. A phase module 808 has an input on line 808 to accept the first clock and an output on lines 810a through 810n to supply a plurality of phase outputs, each having the first clock frequency. Typically, the phase module 808 generates a first clock with a first number of equally-spaced phase outputs. For example, n may be equal to 8, meaning that 8 first clock signals are supplied, offset from the nearest adjacent phase by 45 degrees, A phase selection multiplexer 812 has an input on lines 810a-810n to accept the plurality of first clock phase outputs, an input on line 814 to accept a control signal for selecting a first clock signal phase, and an output on line 816 to supply a prescalar clock with a frequency equal to the (synthesized signal frequency/R, where R=J·S, A daisy-chain register controller 818 has an input on line 820 to accept the pre-divisor value R and an output on line 814 to supply the control, signal for selecting the first clock phase outputs. A low-speed module 822 has an input on line 816 to accept the prescalar clock and an output on line 216 to supply a divided prescalar clock with a frequency equal to the (divisor/R). A scaler 822 accepts the divisor on line 112, supplies the R value of line 820, and supplies division information to the low speed divider 802 on line 824. Returning briefly to FIG. 4, the PFD 202 compares the divided prescalar clock frequency on line 216 to the reference clock frequency and generates a synthesized signal, correction voltage on line 218. In some aspects, the divided prescalar clock signal on line 216 is feedback to the flexible accumulator module 110.

Figure 9:
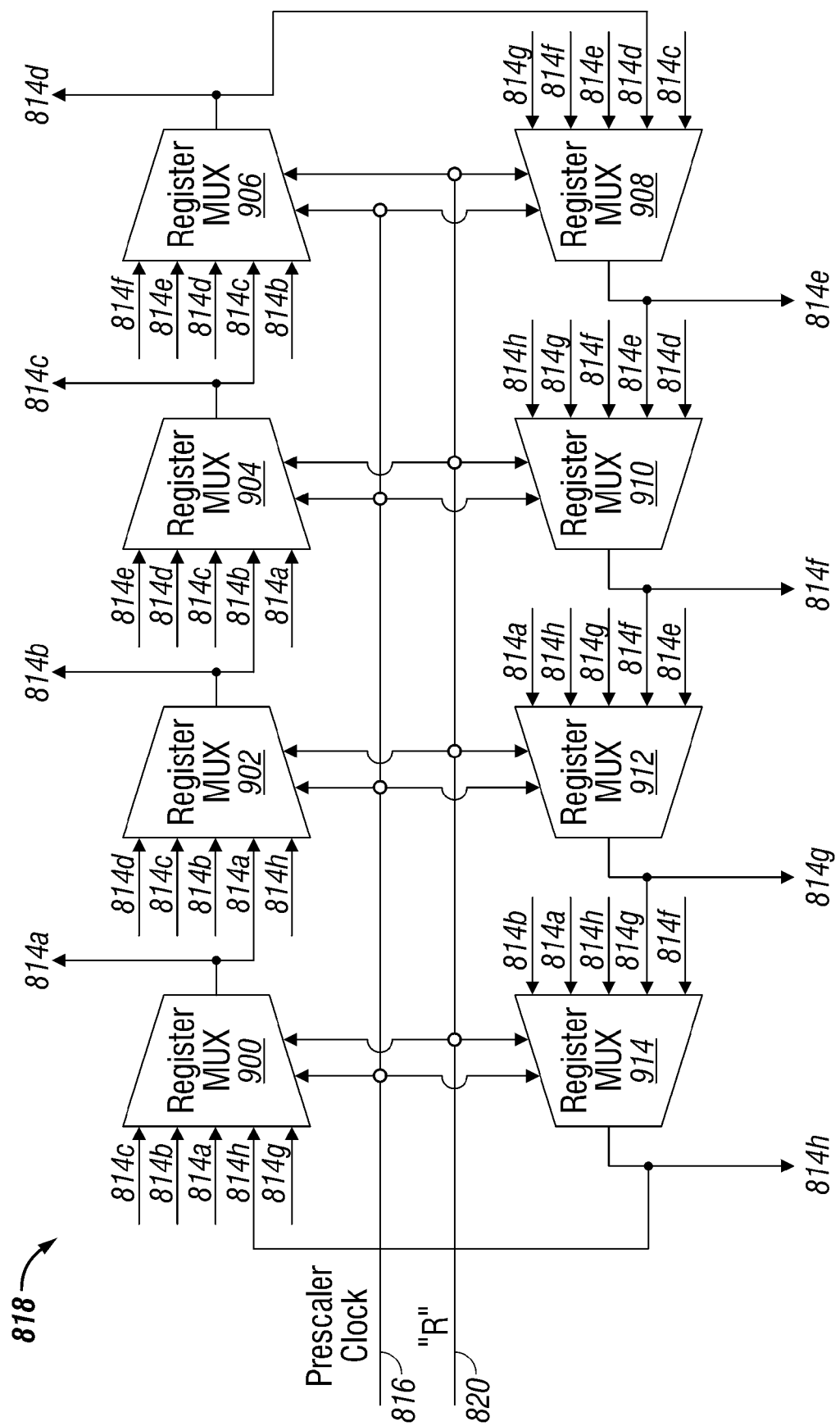
FIG. 9 is a block diagram depicting the daisy-chain controller of FIG. 8 in greater detail.

FIG. 9 is a block diagram depicting the daisy-chain, controller of FIG. 8 in greater detail. The daisy-chain register controller 818 accepts the prescalar clock on line 816 as a clock signal to registers 900 through 914 having outputs connected in a daisy-chain. The controller 818 generates a sequence of register output pulses 814a through 814h in response to the clock signals, and uses the generated register output pulses to select the first clock phase outputs.

The daisy-chain register controller 818 iteratively selects sequences of register output pulses until a first pattern of register output pulses is generated. Then, the phase selection multiplexer (816, see FIG. 8) supplies phase output pulses having a non-varying first period, generating a prescalar clock frequency equal to the (first clock frequency) S, where S is either an integer or non-integer number. Additional details of the high speed divider and daisy-chain controller may be found in parent application Ser. No. 11/717,261.

Figure 10:
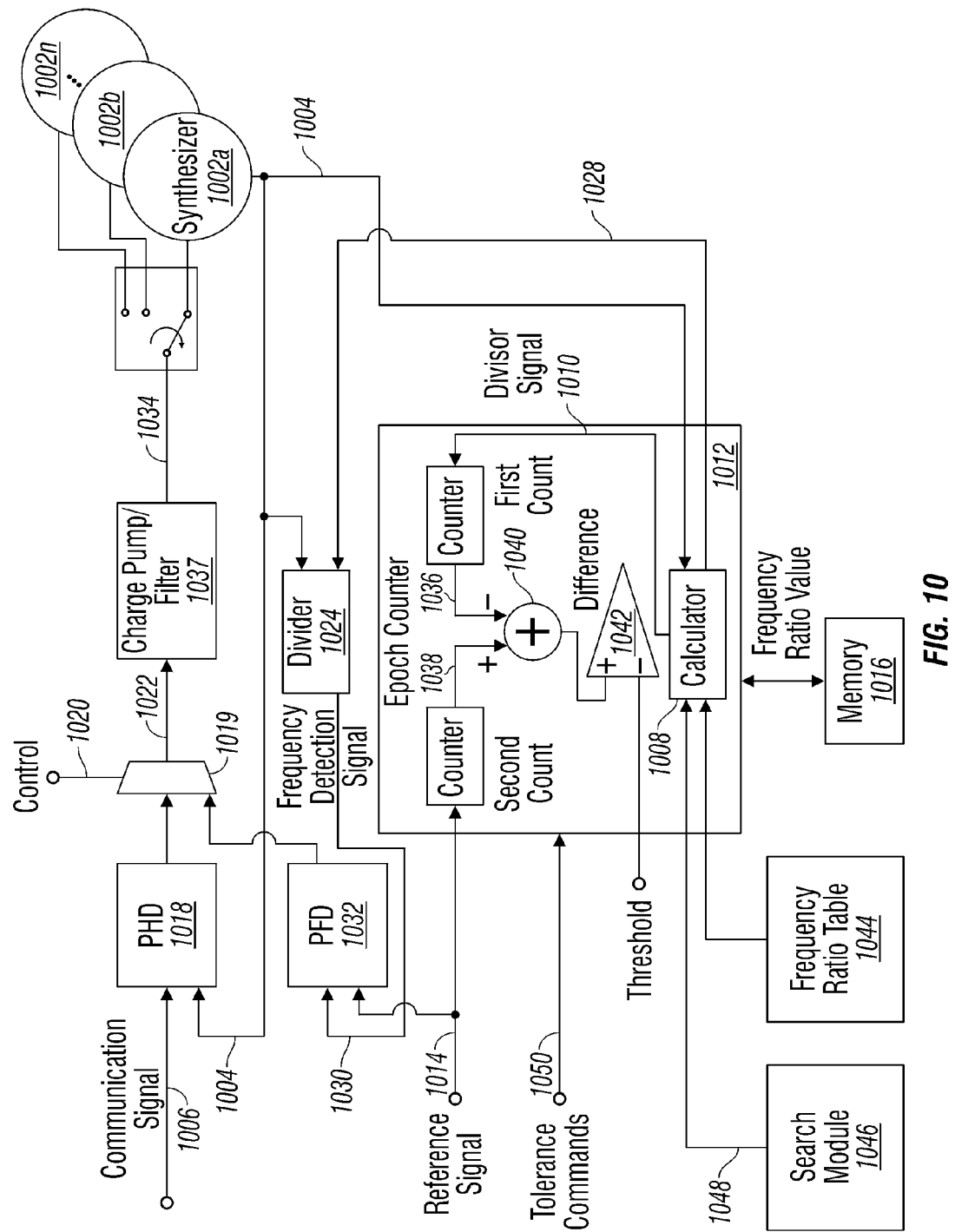
FIG. 10 is a schematic block diagram depicting a system for reacquiring a non-synchronous communication signal in a clock, and data recovery (CDR) device frequency synthesizer.

FIG. 10 is a schematic block diagram depicting a system for reacquiring a non-synchronous communication signal in a clock and data recovery (CDR) device frequency synthesizer. It should be understood that aspects of the system 1000 are enabled by, or work in junction with elements of the system described above in FIGS. 3-9. System 1000 comprises a first synthesizer 1002a having an output on line 1004 to supply a synthesized signal having an output frequency locked in phase to a non-synchronous communication signal on line 1006, which has an input data frequency. A calculator module 1008 has an input to accept the synthesized signal on line 1004. The calculator module 1008 selects a frequency ratio value, divides the output frequency by the selected frequency ratio value, and supplies a divisor signal having a divisor frequency at an output on line 1010.

An epoch counter 1012 has an input on line 1010 to accept the divisor signal frequency and an input on line 1014 to accept a reference signal frequency. The epoch counter 1012 compares the divisor frequency to the reference signal frequency, and in response to the comparing, saves the frequency ratio value in a tangible memory medium 1016.

A phase detector (PHD) 1018 is shown, selectable engaged in a phase-lock mode in response to a control signal to multiplexer (MUX) 1019 on line 1020, with an input on line 1006 to accept the communication signal, an input on line 1004 to accept the synthesized signal, and an output on line 1022 to supply phase information. One example of a PHD can be found in an article authored by Charles Hogge Jr. entitled, "A Self Correcting Clock Recovery Circuit", IEEE Journal of Lightwave Technology, Vol. LT-3, pp. 1312-1314, December 1985, which is incorporated herein by reference. However, other phase detector designs are also suitable.

A phase-frequency detector (PFD) 1032 is selectable engaged, in the frequency acquisition, mode, responsive to a control signal on line 1020. The PFD 1032 has an input on line 1014 to accept the reference signal frequency, an input on line 1030 to accept a frequency detection signal, and an output on line 1022 to supply frequency information. Thus, the first synthesizer 1002a has an input on line 1034 to accept either phase information in the PHD mode or frequency information in the PFD mode. Also shown, is a charge pump/filter 1037 interposed between lines 1022 and 1034. One example of a PFD can be found in an article authored by C. Andrew Sharpe entitled, "A 3-state phase detector can improve your next PLL design", EDN Magazine, pp. 224-228, Sep. 20, 1976, which is incorporated herein by reference. However, other phase detector designs are also suitable.

A divider 1024 is engaged in the frequency acquisition (PFD) mode. The divider has an input on line 1028 to accept the frequency ratio value, an input on line 1004 to accept the synthesized signal output frequency, and an output on line 1030 to supply a frequency detection signal equal to the output frequency divided by the frequency ratio value.

The epoch counter 1012 retrieves the frequency ratio value from memory 1016 for supply to the divider 1024, in response to a loss of lock between the synthesized signal and the communication signal in the phase-lock mode, triggering the frequency acquisition mode.

The PHD 1018 compares the communication signal on line 1006 to the synthesized signal on line 1004 in the phase-lock mode and reacquires the phase of the communication, signal, subsequent to PFD loop supplying a synthesized signal, having the first frequency in the PFD mode.

The calculator 1008 selects a frequency ratio value equal to the output frequency divided by the reference frequency. The epoch counter 1012 compares the divisor signal frequency to the reference signal frequency by counting divisor signal cycles and creating a first count on line 1036. The epoch counter 1012 also counts reference signal cycles and creates a second count on line 1038. The epoch counter 1012 finds the difference between the first and second counts, as represented by summing circuit 1040, and compares the difference to a maximum threshold value input, as represented using comparator 1042.

In one aspect, the epoch counter 1012 compares the difference to the maximum threshold value by ending a coarse search for a frequency ratio value if the difference is less than the maximum threshold value, and reselects a frequency ratio value if the difference is greater than the maximum threshold value. The calculator 1008 selects the frequency ratio value by accessing a range of frequency ratio values corresponding to a range of output frequencies from table 1044. For example, the calculator 1008 selects a first frequency ratio value from the range of frequency ratio values, and reselects the frequency ratio value by selecting a second frequency value from the range of frequency ratio values in table 1044.

In one aspect, a search module 1046 has an output on line 1048 to supply search algorithm commands based upon a criteria such as step size, step origin, step direction, and combinations of the above-mentioned criteria. The calculator 1008 selects the first and second frequency ratio values in response to the search algorithm commands accepted at an input on line 1048.

In one aspect, the epoch counter 1012 compares the divisor frequency to the reference signal frequency by creating first and second counts with respect to a first time duration, and subsequent to ending the coarse search, initiates a line search by creating first and second counts with respect to a second time duration, longer than the first time duration. In other words, the fine search uses a longer time period to collect a greater number of counts for comparison.

In another aspect, the epoch counter 1012 has an input on line 1050 to accept tolerance commands for selecting the maximum threshold value. Then, the calculator 1008 reselects a frequency ratio value if the difference is greater than the selected maximum tolerance value.

In one aspect, the system 1000 includes a plurality of synthesizers, each having a unique output frequency hand. Shown are synthesizers 1002a, 1002b, and 1002n, where n is not limited to any particular value. The first synthesizer 1002a is selected from the plurality of synthesizers prior to the frequency detector acquiring the communication signal input data frequency in the frequency acquisition mode. If the system cannot acquire the input data frequency using the first synthesizer 1002a, then second synthesizer 1002b may be selected, until a synthesizer is found that can be locked to the input data frequency.

Figure 11:
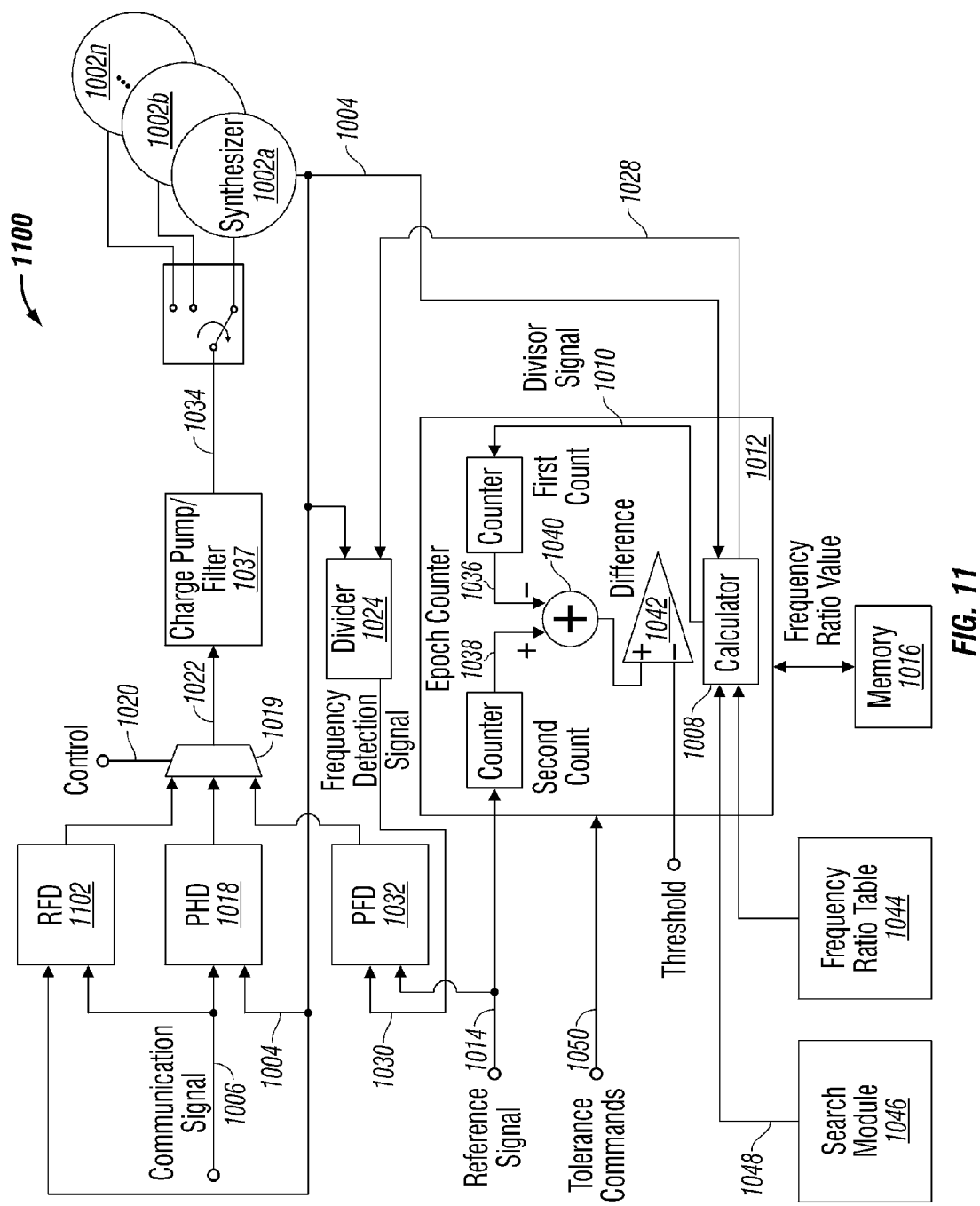
FIG. 11 is a schematic block diagram of a system for holding the frequency of a non-synchronous communication signal in, a CDR device frequency synthesizer.

FIG. 11 is a schematic block diagram of a system for holding the frequency of a non-synchronous communication signal in a CDR device frequency synthesizer. The system 1100 includes elements of the system depicted in FIG. 10, except that a rotational frequency detector (RFD) 1102 is included. RFDs are well known in the art, but the elements shown in FIG. 11 are combined to provide a unique frequency hold function. One example of an RFD can be found, in an article authored by Pottbacker et al. entitled, "A Si Bipolar Phase and Frequency Detector IC for Clock Extraction up to 8 Gb/s", IEEE Journal of Solid-State Circuits, Vol. SC-27, pp. 1747-1751, Dec. 1992, which is incorporated herein by reference. However, other phase detector designs are also suitable.

As in FIG. 10, a PLL is shown including a PHD 1018 to acquire the phase of an input non-synchronous first communication signal on line 1006 having a first frequency, with respect to a first synthesized signal on line 1004, and to supply a synthesizer control signal on line 1022. A synthesizer 1002a has an input to accept the synthesizer control signal on line 1034, after conditioning by charge pump/filter 1037, and an output to supply the first synthesized signal on line 1004.

While the PHD is phase-locked to the first, communication signal on line 1006, the epoch counter determines the frequency ratio value, as described in detail in the explanation of FIG. 10. The frequency ratio value is equal to the first synthesized signal frequency divided by the reference frequency on line 1014. Alternately stated, the frequency detection signal has a frequency equal to a reference signal frequency on line 1014. As described in FIG. 10, the divider 1024 is part of a PFD loop. Advantageously, the system depicted in FIG. 11 uses only a single reference signal frequency, regardless on the frequency of the communication signal on line 1006. The selected frequency ratio value is saved in tangible memory medium 1016.

The PFD loop is enabled in response to the PLL receiving a second communication signal, with a non-predetermined second frequency. As in FIG. 10, the PFD loop includes PFD 1032 having inputs on lines 1030 and 1014 to accept a frequency detection signal and the reference signal, respectively, and an output on line 1022 to supply a synthesizer control signal. Divider 1024 has an input on line 1004 to accept a second synthesized signal, and an input on line 1028 to accept the frequency ratio value retrieved from memory. Divider 1024 has an output on line 1030 to supply the frequency detection signal equal to the reference signal frequency. The synthesizer 1002a generates the second synthesized signal having an output frequency equal to the first frequency.

An RFD loop is enabled in response to the PFD generating the second synthesized signal with the first frequency. The RFD loop includes an RFD 1102 having inputs to accept the second synthesized signal and the second communication signal on lines 1004 and 1006, respectively, and an output to supply a synthesizer control signal on line 1022. The synthesizer 1002a generates the second synthesized signal having an output frequency equal to the second frequency.

Subsequent to the RFD loop acquiring second frequency, the PLL is enabled using control signals on line 1020. The PHD 1018, compares the second synthesized signal on line 1004 to the second communication signal 1006, and acquires the phase of the second communication signal. In some aspects, the epoch counter 1012 updates the frequency ratio value in response to the PHD acquiring the phase of the second communication signal, and stores the updated frequency ratio value in memory 1016. The second communication signal may he the first communication signal, temporarily interrupted or transmitted in a bursty manner. Alternately, the second communication signal may be the first communication signal with a frequency drift. Typically, the RFD generates a second synthesized signal with a second frequency within a range of about ±50% of the first frequency.

Figure 12:
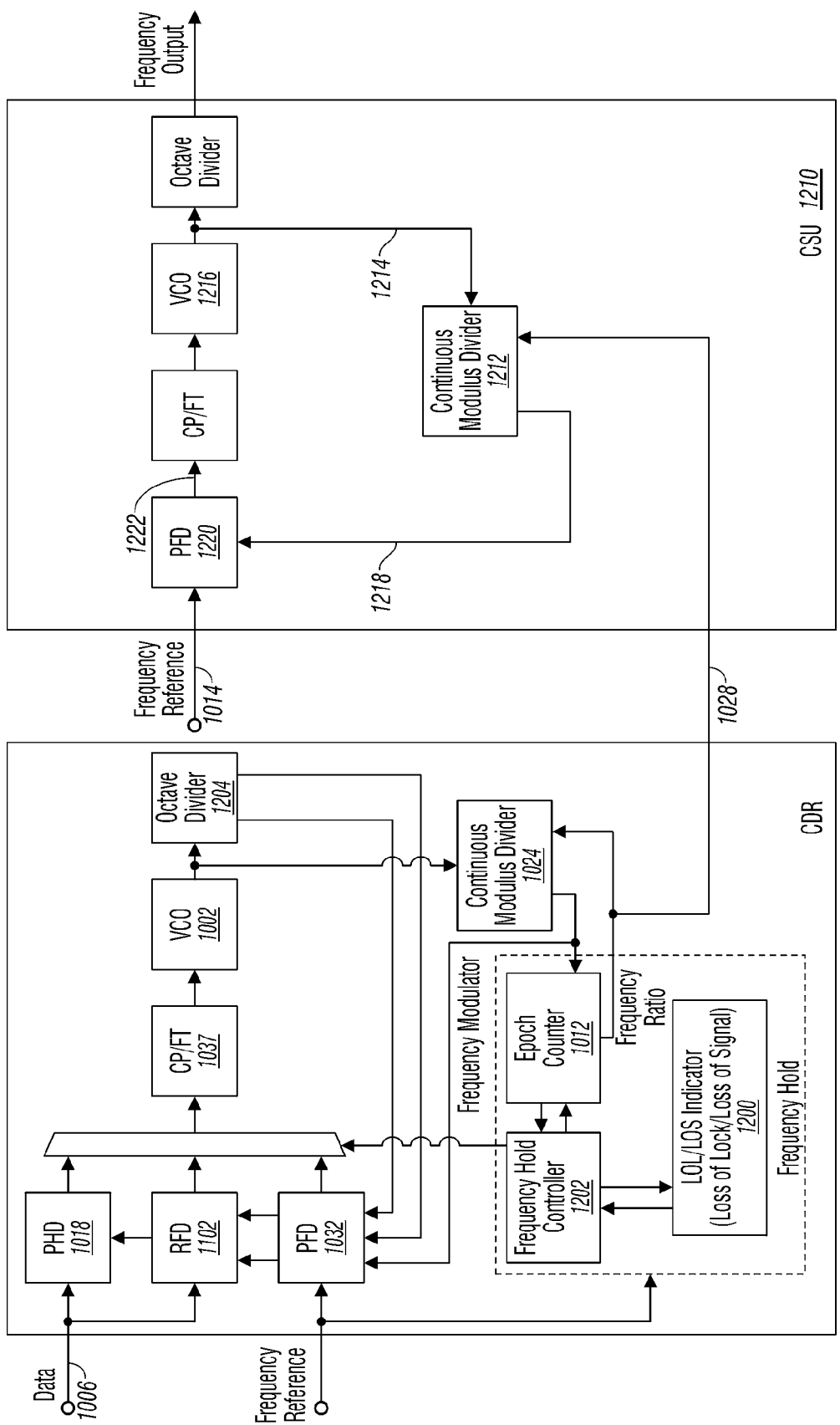
FIG. 12 is a schematic block diagram depicting additional details of the system of FIG. 11.

FIG. 12 is a schematic block diagram depicting additional details of the system of FIG. 11. A clock synthesis unit (CSU) 1210 is shown with a second PFD loop. The PFD includes a divider 1212 having inputs on lines 1214 and 1028 to accept a synthesized signal from synthesizer 1216 and the frequency ratio value, respectively. Divider 1212 has an output on line 1218 to supply a second frequency detection signal. A second PFD 1220 has inputs to accept the second frequency detection signal on line 1218 and the reference signal on line 1014. PFD 1220 has an output on line 1222 to supply a synthesizer control signal. The synthesizer 1216 generates a CSU operating frequency equal the first frequency.

Returning to FIG. 11, an epoch counter 1012 compares a divisor signal on line 1010, created by dividing the synthesized signal on line 1004 with an estimate of the frequency ratio value, with the reference signal on line 1014. The epoch counter has an output on line 1028 to supply the (final) frequency ratio value in response to iteratively comparing the divisor signal to the reference signal as frequency value estimates are varied. As described above in the explanation of FIG. 10, the epoch counter 1012 compares the divisor signal on line 1010 to the reference signal on line 1014 by counting divisor signal cycles and creating a first count on line 1036. The epoch counter 1012 counts reference signal cycles and creates a second count on line 1038, finds the difference between the first and second counts (the signal from summing circuit 1042), and compares the difference to a maximum threshold value input using comparator 1042.

The epoch counter 1012 compares the difference to the maximum threshold value by ending a search for a frequency ratio value if the difference is less than the maximum threshold value, and reselects a frequency ratio value if the difference is greater than the maximum threshold value. The epoch counter 1012 selects the frequency ratio value by accessing a range of frequency ratio values from table 1044 corresponding to a range of output frequencies, selects a first frequency ratio value from the range of frequency ratio values, and reselects the frequency ratio value by selecting a second frequency value from the range of frequency ratio values.

Although the above-described systems have been depicted as a combination of connected hardware elements, some aspects parts of the system may be enabled using software instructions stored in memory that are called and performed by a processor or logic-coded state machine device (not shown).

Functional Description

Returning to FIG. 12, three main, functions used to implement frequency bold are the epoch counter 1012, the LOL/LOS Indicator (LSI) 1200, and Frequency Hold Controller (FHC) 1202. During the time of LSI deassertion (lock), the FHC 1202 instructs the epoch counter 1012 to determine the frequency ratio value, which corresponds to the current input data rate On line 1006. If LSI is asserted (loss of lock) then the frequency ratio is used by the divider (continuous modulus divider) 1024 to maintain the operating frequency. As a result, CDR can adapt quickly when the LSI 1200 changes from assertion to deassertion. The numberings (1-11) in the figure demonstrates steps in the frequency hold process.

1. CDR is locked to an unspecified input data rate with the phase detector (PHD) in the PLL (i.e. the first communication signal).
2. LSI is deasserted (phase lock).
3. FHC 1202 instructs the epoch counter to begin the process of indirectly determining the input, data rate by finding the frequency ratio value, which is related to the synthesized frequency and the reference frequency. Note: in this depiction, a fixed rate divider 1204 is added to the loop.
4. The frequency ratio value status is reported to FHC 1202.
5. LSI is asserted (loss of lock).
6. FHC 1202 changes CDR mode from PHD (PLL) to PFD.
7. The frequency ratio value is supplied to the divider 1024 and the CSU 1106.
8. The operating (first) frequency is maintained at the frequency of the previously received input data rate. Frequency hold is in effect without the input data signal, see FIG. 13. From the system point of view, the CRU and the CSU are operating at exactly the same frequency as before the loss of signal.
9. LSI is deasserted.
10. The FHC 1202 changes to the RFD in order to be safely locked to the new input data rate, assuming that the new input signal has a data rate close to the data rate of the initial (first) communication signal, or that the first communication signal is only interrupted. This feature is possible because of the RFD's capacity to tolerate a range of frequency variation. As a result, if the input data varies with respect to the previous input data rate, then the RFD is able to lock quickly, without performing an extensive frequency acquisition.
11. After the RFD is locked, the CDR changes to the PHD for phase lock. Return to Step 1.

Figure 13:
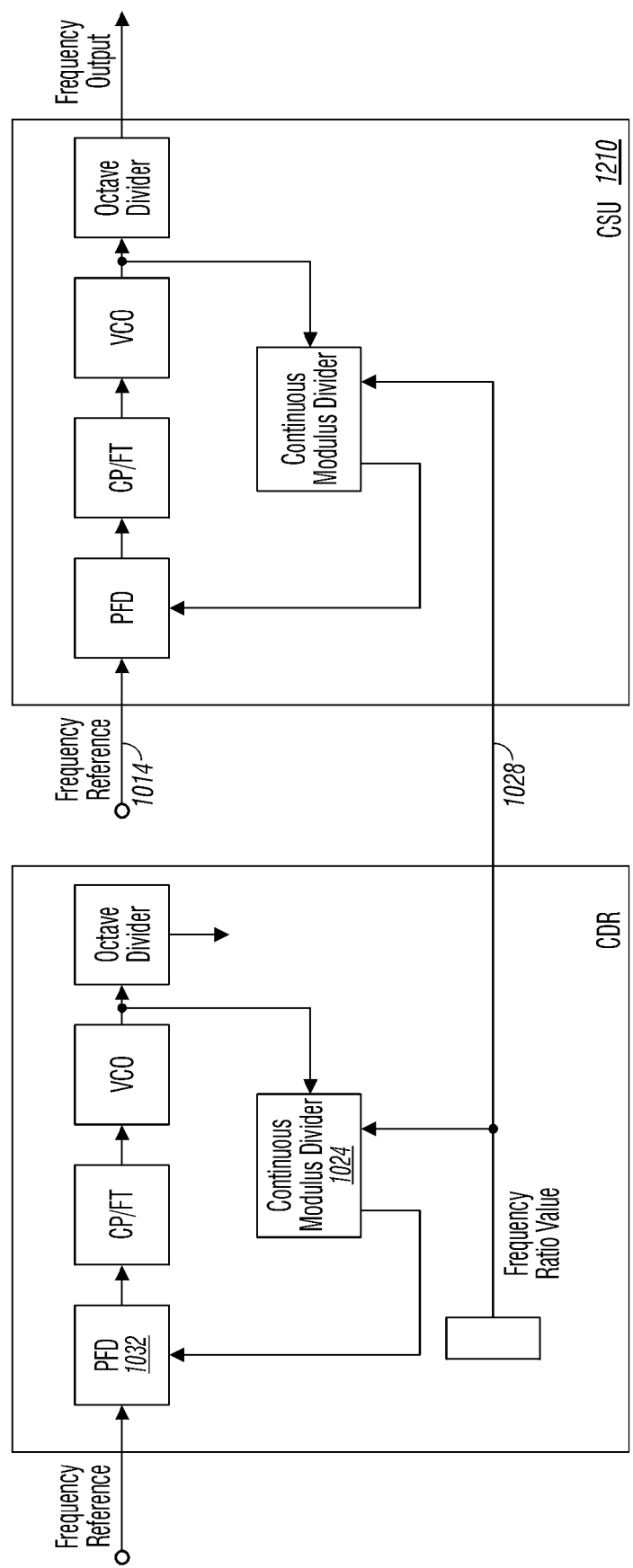
FIG. 13 is a schematic block diagram depicting the system of FIGS. 11 and 12 in the phase-frequency loop mode.

FIG. 13 is a schematic block, diagram, depicting the system of FIGS. 11 and 12 in the phase-frequency loop mode.

Returning to FIG. 11, in the continuous rate CDR system, the frequency ratio detection is performed after the PLL loop has been locked by PHD. When the CDR system is locked, the frequency range of selected VCO band already is known. Therefore, it is possible to search in a range of frequency ratio values for the frequency ratio value corresponding to the input data rate.

The LOL/LOS Indicator is responsible for gathering indicators such as data rate variations, signal strength variations, frequency variations. Based on the LOL/LOS status, the frequency hold controller initiates the frequency hold process.

Figure 14:
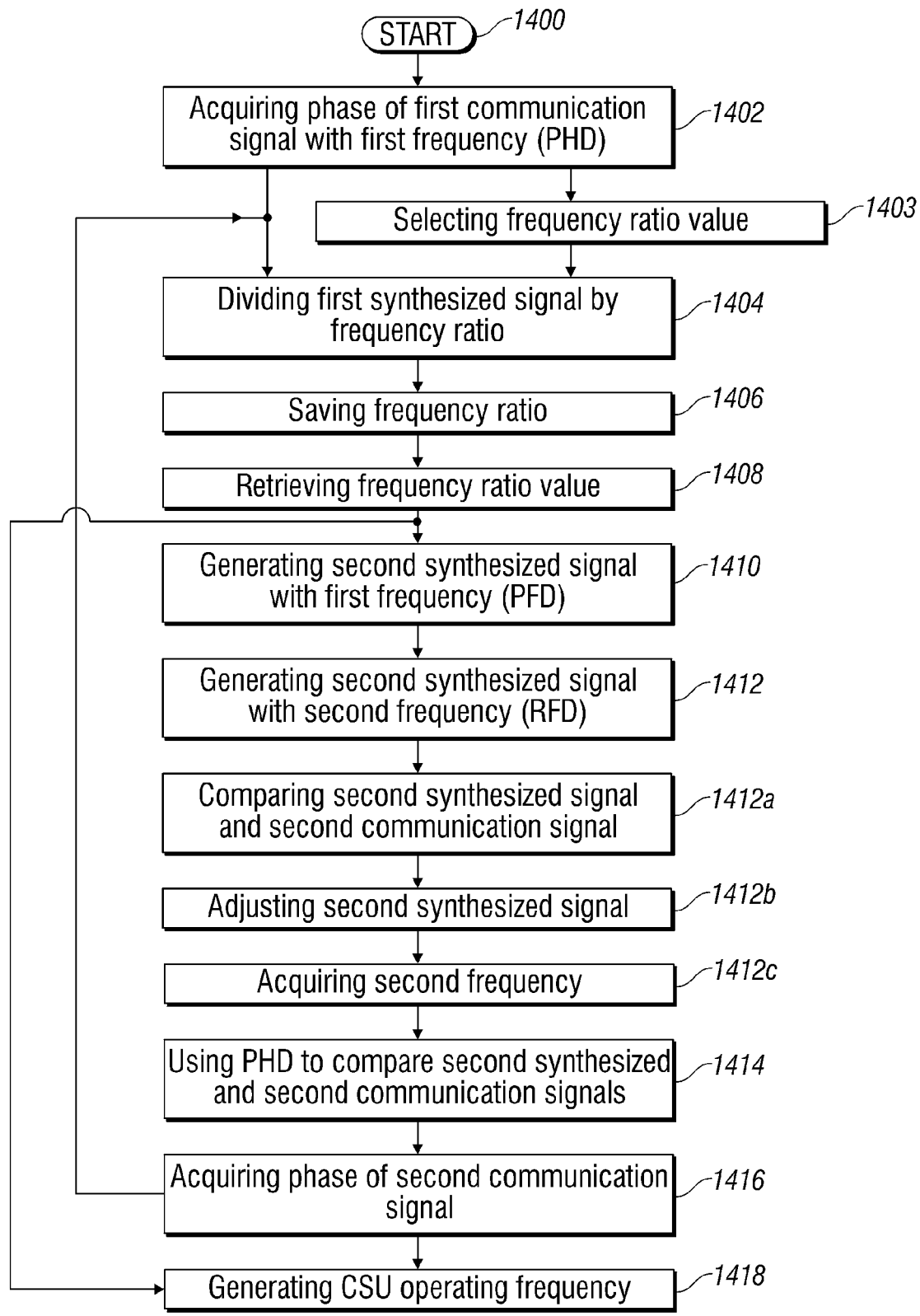
FIG. 14 is a flowchart illustrating a method for holding the frequency of a non-synchronous communication signal in a CDR device frequency synthesizer.

FIG. 14 is a flowchart illustrating a method a method for holding the frequency of a non-synchronous communication signal in a CDR device frequency synthesizer. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1400.

Step 1402 acquires the phase of a non-synchronous first communication signal having a first frequency. In response to acquiring the phase of the first frequency, Step 1404 divides a first synthesized signal by a selected frequency ratio value, creating a frequency detection signal having a frequency equal to a reference signal frequency. That is, a frequency ratio value is selected that is equal to the first synthesized signal frequency divided by the reference signal frequency. See the discussion of FIGS. 5-7 to appreciate the accuracy of the calculated frequency ratio value. Advantageously, only one reference frequency is required, regardless of the input frequency or the frequency ratio value required.

Step 1406 saves the frequency ratio value in a tangible memory medium. In response to losing the first communication signal and subsequently receiving a second communication signal with a non-predetermined second frequency, Step 1408 retrieves the frequency ratio value from memory. Using a PFD, the frequency ratio value, and the reference signal, Step 1410 generates a second synthesized signal having the first frequency. Using an RFD, the second communication signal, and the second synthesized signal, Step 1412 generates the second synthesized signal having an output frequency equal to second frequency. Typically, the second communication signal and second synthesized signal generated in Step 1412 have a second frequency within a range of about ±50% of the first frequency.

In one aspect, generating the second synthesized, signal with the second frequency includes substeps. Using the RFD, Step 1412a compares the second, synthesized signal to the second communication signal. In response to comparing. Step 1410b adjusts the second synthesized output frequency. Step 1410c acquires the second frequency.

Subsequent to acquiring second frequency in Step 1412, Step 1414 uses the PHD to compare the second synthesized output frequency to the second communication signal. Step 1416 acquires the phase of the second communication signal. In one aspect, the frequency ratio value is updated in Step 1404, and the updated frequency ratio value is stored in Step 1406.

In another aspect, Step 1418 generates a clock synthesis unit (CSU) operating frequency equal the first frequency using a phase-frequency detector (PFD), the frequency ratio value, and the reference signal frequency.

In a different aspect, Step 1403 selects the frequency ratio value by counting divisor signal cycles, and creating a first count, where the divisor signal, is found from dividing the first synthesized frequency by an estimate of the frequency ratio value. Step 1403 also counts reference signal cycles, creating a second count. Then, Step 1403 finds the difference between the first and second counts, and compares the difference to a maximum threshold value.

In one aspect, Step 1403 compares the difference to the maximum threshold value by accessing a range of frequency ratio values corresponding to a range of output frequencies, and selecting a first frequency ratio value from the range of frequency ratio values. The search for the frequency ratio value is ended if the difference is less than the maximum threshold value. Otherwise, a second frequency value from the range of frequency ratio values is selected if the difference is greater than the maximum threshold value.

A system and method, have been provided for holding the frequency of a non-synchronous communication signal in a CDR device frequency synthesizer. Some examples of circuitry and methodology steps have been given as examples to illustrate the invention. However, the invention is not limited to merely these examples. Other variations and embodiments of the invention will occur to those skilled in the art.

We claim:

1. In a clock and data recovery (CDR) device frequency synthesizer, a method for holding the frequency of a non-synchronous communication signal, the method comprising:
   using a phase detector (PHD) to acquire the phase of a non-synchronous first communication signal having a first frequency;
   in response to acquiring the phase of the first frequency, dividing a first synthesized signal by a selected frequency ratio value, creating a frequency detection signal having a frequency equal to a reference signal frequency;
   saving the frequency ratio value in a tangible memory medium;
   in response to losing the first communication signal and subsequently receiving a second communication signal with a non-predetermined second frequency, retrieving the frequency ratio value from memory;
   using a phase-frequency detector (PFD), the reference signal, and the frequency ratio value, generating a second synthesized signal with the first frequency; and,
   in response to using the PFD to generate the second synthesized signal with the first frequency, using a rotational frequency detector (RFD) to generate the second synthesized signal having an output frequency equal to second frequency.

2. The method of claim 1 wherein. generating the second synthesized signal equal to the second frequency includes:
   using the RFD, comparing the second synthesized signal to the second communication signal;
   in response to comparing, adjusting the second synthesized output frequency; and,
   acquiring the second frequency.

3. The method of claim 2 further comprising:
   subsequent to using the RFD to acquire the second frequency, using the PHD to compare the second synthesized output frequency to the second communication signal; and,
   acquiring the phase of the second communication signal.

4. The method of claim 3 farther comprising:
   subsequent to acquiring the phase of the second communication signal, updating the frequency ratio value; and,
   storing the updated frequency ratio value in memory.

5. The method of claim 1 wherein dividing the first synthesized signal by the selected frequency ratio value includes selecting a frequency ratio value equal to the first synthesized signal frequency divided by the reference signal frequency.

6. The method of claim 1 wherein. using the RFD to generate the sect d synthesized signal having the second frequency includes generating a second synthesized signal with a second frequency within a range of about ±50% of the first frequency.

7. The method of claim 1 further comprising:
   using a phase-frequency detector (PFD), the frequency ratio value, and the reference signal frequency, generating a clock synthesis unit (CSU) operating frequency equal the first frequency.

8. The method of claim 5 further comprising:
   selecting the frequency ratio value as follows:
      counting divisor signal cycles, creating a first count, where the divisor signal is found from dividing the first synthesized frequency by an estimate of the frequency ratio value;
      counting reference signal cycles, creating a second count;
      finding the difference between the first and second counts; and, comparing the difference to a maximum threshold value.

9. The method of claim 8 wherein comparing the difference to the maximum threshold value includes:
   accessing a range of frequency ratio values corresponding to a range of output frequencies;
   selecting a first frequency ratio value from the range of frequency ratio values;
   ending a search for the frequency ratio value if the difference is less than the maximum threshold value; and,
   selecting a second frequency value from the range of frequency ratio values if the difference is greater than the maximum threshold value.

10. In a clock and data recovery (CDR) device frequency synthesizer, a system for holding the frequency of a non-synchronous communication signal, the system. comprising:
   a phase-locked loop (PLR) including:
      a phase detector (PHD) to acquire the phase of an input non-synchronous first communication signal having a first frequency, with respect to a first synthesized signal, and to supply a synthesizer control signal;
      a first synthesizer having an input to accept the synthesizer control signal and an output to supply the first synthesized signal;
      an epoch counter having inputs to accept a divisor signal, created by dividing the first synthesized by an estimate of a frequency ratio value, and the reference signal, and an output to supply the frequency ratio value in response to the comparing the divisor signal to the reference signal;
      a tangible memory medium for saving the frequency ratio value;
   a phase-frequency detector (PFD) loop enabled in response to the PLL receiving a second communication signal with a non-predetermined second frequency, the PFD loop including:
      a PFD having inputs to accept a frequency detection signal and the reference signal, and an output to supply a synthesizer control signal;
      a divider having inputs to accept a second synthesized signal and the frequency ratio value retrieved from memory, and an output to supply the frequency detection signal equal to the reference signal frequency; and, the first synthesizer generating the second synthesized signal having an output frequency equal to the first frequency;

a rotational frequency detector (RFD) loop enabled in response to the PFD generating the second synthesized signal, the RFD loop including:

a RFD having inputs to accept the second synthesized signal and the second communication signal, and an output to supply a synthesizer control signal; and, the first synthesizer generating the second synthesized signal having an output frequency equal to the second frequency.

11. The system of claim 10 wherein the PHD, subsequent to the RFD loop acquiring second frequency, compares the second synthesized signal to the second communication signal, and acquires the phase of the second communication signal.

12. The system of claim 11 wherein the epoch counter updates the frequency ratio value in response to the PHD acquiring the phase of the second communication signal, and stores the updated. frequency ratio value in memory.

13. The system of claim 10 wherein the epoch counter supplies a frequency ratio value to the divider equal to the first synthesized signal frequency divided by the reference frequency.

14. The system of claim 13 wherein the RFD generates a second synthesized signal with a second frequency within a range of about ±50% of the first frequency.

15. The system of claim 10 further comprising:

a clock synthesis unit (CSU) with a second PFD loop including:

a second divider having inputs to accept a synthesized signal from a second synthesizer and the frequency ratio value, and an output to supply a second, frequency detection signal;

a second PFD having inputs to accept the second frequency detection signal. and the reference signal, and an output to supply a synthesizer control signal; and, the second synthesizer generating a CSU operating frequency equal the first frequency.

16. The system of claim 10 wherein the epoch counter compares the divisor signal to the reference signal by counting divisor signal cycles and creating a first count, counting reference signal cycles and creating a second count, finding the difference between the first and second counts, and comparing the difference to a maximum threshold value input.

17. The system of claim 16 wherein the epoch counter compares the difference to the maxim m threshold value by ending a search for a frequency ratio value if the difference is less than the maximum threshold value, and reselects a frequency ratio value if the difference is greater than the maximum threshold value.

18. The system of claim 17 wherein the epoch counter selects the frequency ratio value by accessing a range of frequency ratio values corresponding to a range of output frequencies, selects a first frequency ratio value from the range of frequency ratio values, and reselects the frequency ratio value by selecting a second frequency value from the range of frequency ratio values.

* * * * *

UNITED STATES PATENT AND TRADEMARK OFFICE
CERTIFICATE OF CORRECTION

| | |
|---|---|
| PATENT NO. | : 8,094,754 B2 |
| APPLICATION NO. | : 12/327776 |
| DATED | : January 10, 2012 |
| INVENTOR(S) | : Mehmet Eker et al. |

It is certified that error appears in the above-identified patent and that said Letters Patent is hereby corrected as shown below:

Column 2 line 28 – the "," should be a ".".

Column 2 lines 51 through 54 – all "·" have been printed as "-", the correct equations are as follows:

contribution 1 = c1[n];
contribution 2 = c2[n] - c2[n-1];
contribution 3 = c3[n] - 2c3[n-1] + c3[n-2];
contribution 4 = c4[n] - 3c4[n-1] + 3c4[n-2] - c4[n-3];

Column 3 line 33 – the "," should be a ".".

Column 3 line 54 – the abbreviation "RED" should be "RFD".

Column 8 line 30 – the phrase "contribution=0-1 -1" should be "contribution = 0 -1 = -1".

Claim 8 (Column 16 line 4) – the phrase "sect d" should be "second".

Claim 15 (Column 18 line 6) – an extra --.-- has been inserted between the first instance of the word "signal" and the first instance of the word "and".

Claim 17 (Column 18 line 17) – the phrase "maxim m" should be "maximum".

Signed and Sealed this
Thirteenth Day of March, 2012

David J. Kappos
*Director of the United States Patent and Trademark Office*